(12) United States Patent
Aji et al.

(10) Patent No.: US 6,480,996 B1
(45) Date of Patent: Nov. 12, 2002

(54) SYSTEM AND METHOD FOR TRANSPOSING WIRES IN A CIRCUIT DESIGN

(75) Inventors: Sandeep A. Aji, San Jose, CA (US); Shantanu Ganguly, Austin, TX (US); John Paz, Santa Clara, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 266 days.

(21) Appl. No.: 09/610,746

(22) Filed: Jul. 6, 2000

(51) Int. Cl.$^7$ .............................................. G06F 17/50
(52) U.S. Cl. ......................................... 716/12; 716/13
(58) Field of Search ............................ 716/1, 6, 12–18

(56) References Cited

U.S. PATENT DOCUMENTS

| | | | |
|---|---|---|---|
| 5,481,695 A | 1/1996 | Purks | 395/500 |
| 5,623,420 A | 4/1997 | Yee et al. | 364/490 |
| 5,657,241 A * | 8/1997 | Butts et al. | 716/16 |
| 5,784,600 A * | 7/1998 | Doreswamy et al. | 713/503 |
| 5,798,935 A | 8/1998 | Doreswamy et al. | 364/488 |
| 5,801,959 A | 9/1998 | Ding et al. | 364/491 |
| 5,838,583 A | 11/1998 | Varadarajan et al. | 364/491 |
| 5,847,965 A | 12/1998 | Cheng | 364/488 |
| 5,926,397 A | 7/1999 | Yamanouchi | 364/491 |
| 5,987,241 A | 11/1999 | Goldberg et al. | 395/500.15 |
| 5,999,726 A | 12/1999 | Ho | 395/500.6 |
| 6,009,251 A | 12/1999 | Ho et al. | 395/500.06 |
| 6,349,403 B1 * | 2/2002 | Dutta et al. | 716/12 |

OTHER PUBLICATIONS

"Routing for Complex SoC Designs", Synopsys, Inc.; Oct. 1999; pp. 1–14.

* cited by examiner

Primary Examiner—Vuthe Siek
Assistant Examiner—Paul Dinh
(74) Attorney, Agent, or Firm—Campbell Stephenson Ascolese LLP

(57) ABSTRACT

An automatic and parameterized compute implemented method for transposing wires in an integrated circuit design can y bus lines with similar impedances, and therefore similar signal transmission characteristics. Using a specially designed CAD tool, a user can specify a transposing porn, intervals at which to transpose wires, and a metal layer through which to accomplish the transposing in the integrated circuit. Using a routing database the tool then automatically determines the locations in the design where transposing needs to be performed, re-routes the wires being transposed while optimizing the circuit design space being used, and re-routes (or causes the re-route of) any other wires affected by the transposing process. The result is a new version of the routing database reflecting transposition, but with no change to the circuit's netlist.

21 Claims, 4 Drawing Sheets

SYSTEM AND METHOD FOR TRANSPOSING WIRES IN A CIRCUIT DESIGN

BACKGROUND OF THE INVENTION

1. Field of the Invention

This invention relates to tools for designing digital circuits and analyzing digital circuit designs, and particularly to transposing wires in digital circuit designs.

2. Description of the Related Art

One of the goals in designing synchronous integrated circuits, and particularly very large scale integrated (VLSI) circuits, including application specific integrated circuits (ASICs), general purpose processors, embedded processors, and digital signal processors (DSPs), is high speed operation. To that end, a variety of computer aided design (CAD) tools are used to design, analyze, and simulate integrated circuits. In the process of designing integrated circuits, often referred to as electronic design automation (EDA), a particular integrated circuit (or section thereof) is typically described by a netlist. The netlist is a list of circuit components or cells and interconnections between the circuit components. The various cell input terminals and output terminals through which cells are connected to each other are often referred to as pins or nodes. The speed at which a given circuit can operate depends in large part on the timing of signals arriving at, and being transmitted from various cells in the circuit.

For example, a bus, i.e., a group of two or more wires (sometimes referred to as nets or bits) that carry closely-associated signals in an electronic design, included in an integrated circuit design can require specific timing characteristics to maintain maximum operating speed for the circuit. If the circuit design depends on well defined relationships among the signals transmitted on the bus lines, anything that affects the signal timing on individual lines of the bus, and/or the relationship among signals on the bus, can affect the overall performance of the circuit. In the case of bus lines, one cause of relative signal timing delays is impedance differences among bus lines. If the impedances of the wires in a bus differ significantly, then signal arrival times, signal edge rates, and clock skew can be very different from one bit line to the next. Apart from the electrical characteristics of the material making up a wire, the impedance of the wire depends on its length, and inductive effects (both self and mutual) associated with the wire. These effects can be particularly significant in buses where the outer wires of the bus present a different impedance than the inner wires of the bus.

Since EDA routing tools are often used to route clock, signal, data, and power paths between various elements of an integrated circuit, one way to alleviate the impedance mismatch among bus wires is via the design rules used in conjunction with the tools. Examples of such routing tools include FlexRoute by Synopsys, Inc., and Envisia Silicon Ensemble (including the Integrated Circuit (IC) Craftsman package) by Cadence Design Systems, Inc. For example, maximum wire length can be restricted to control the total resistance in a line; wire width and length matching can be used to match pairs; and wire spacing can be adjusted to control capacitance and crosstalk between lines. These techniques often have limited effect on the problem, and can cause the area on the die needed for the integrated circuit to increase.

Another common solution is to design a unique driver for each wire in the bus. If all of the lines on the bus are not identical in terms of electrical loading, then the driver for each line has to be individually adjusted to match the characteristics of the specific bus line. Of course, having unique drivers for each wire in the bus can significantly complicate the circuit design process. Moreover, there can be circuit area costs and power consumption costs associated with the unique drivers.

Still another solution is to transpose wires in the bus, thereby giving the wires similar impedances, and obviating the need for individually designed drivers for each of the bus lines. Unfortunately, prior art methods for transposing bus lines have relied on the manual efforts of a circuit designer to select buses from a circuit design, and decide where and how to reroute the bus lines. This process can also be very time consuming, does not guarantee optimal re-routing of bus lines, and thus, may eliminate any benefit gained from not having to design specific drivers for each of the bus lines.

Accordingly, it is desirable to have integrated circuit design tools and techniques for automatically transposing wires in order to reduce cross coupling and to balance bus loading.

SUMMARY OF THE INVENTION

It has been discovered that an automatic and parameterized computer implemented method for transposing wires in an integrated circuit design can yield bus lines with similar impedances, and therefore similar signal transmission characteristics. Using a specially designed CAD tool, a user can specify a transposing pattern, intervals at which to transpose wires, and a metal layer through which to accomplish the transposing in the integrated circuit. Using a routing database the tool then automatically determines the locations in the design where transposing needs to be performed, re-routes the wires being transposed while optimizing the circuit design space being used, and re-routes (or causes the re-route of) any other wires affected by the transposing process. The result is a new version of the routing database reflecting transposition, but with no change to the circuit's netlist.

Transposition of bus lines may also be desirable to make lines that switch in similar logic direction run adjacent to each other. This can help reduce the coupling capacitance of the adjacent lines, and results in a lower delay for a signal propagating through a wire.

Accordingly, one aspect of the present invention provides a computer implemented method of transposing a plurality of wires in a circuit design. A database is provided including a plurality of wire descriptions, each of the plurality of wire descriptions including a path traversed by the wire in the circuit design. A transposing region is defined around portions of a first and a second path corresponding to a first and a second wire description of the plurality of wire descriptions, respectively. The transposing region dividing the first path into a first leading path segment, a first transposing path segment, and a first ending path segment, and the transposing region further dividing the second path into a second leading path segment, a second transposing path segment, and a second ending path segment. The first transposing path segment is replaced with a first new transposing path segment between the first leading path segment and the second ending path segment, thereby modifying the first path for the first wire description. The second transposing path segment is replaced with a second new transposing path segment between the second leading path segment and the first ending path segment, thereby modifying the second path for the second wire description.

In another aspect of the present invention provides a computer implemented method of transposing a plurality of wires in a circuit design. A database is provided including a plurality of wire descriptions, each of the plurality of wire descriptions including a path traversed by the wire in the circuit design. A wire transposing pattern is received for application to at least a first and a second wire description of the plurality of wire descriptions. A first portion of the first wire description path is replaced with a first new portion, and replacing a second portion of the second wire description path with a second new portion such that the first wire description path and the second wire description path are transposed according to the transposing pattern.

In another aspect of the invention, an apparatus includes a processor, a memory coupled to the processor, and a circuit design program at least partially storable in the memory, and executable on the processor. The program includes a wire selection routine, a transposing region definition routine, and a replacement routine. The wire selection routine selects a plurality of wire descriptions from a database, each of the plurality of wire descriptions including a path traversed by the wire in a circuit design. The transposing region definition routine defines a transposing region around portions of a first and a second path corresponding to a first and a second wire description of the plurality of wire descriptions, respectively. The transposing region divides the first path into a first leading path segment, a first transposing path segment, and a first ending path segment, and the transposing region further divides the second path into a second leading path segment, a second transposing path segment, and a second ending path segment. The replacement routine replaces the first transposing path segment with a first new transposing path segment between the first leading path segment and the second ending path segment, thereby modifying the first path for the first wire description.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

In the following description, numerous specific details are set forth in order to provide a thorough understanding of the present invention. It will be obvious, however, to one having ordinary skill in the art that the present invention may be practiced without these specific details. In other instances, well-known circuits, structures and techniques have not been shown in detail in order not to unnecessarily obscure the present invention.

Figure 1:
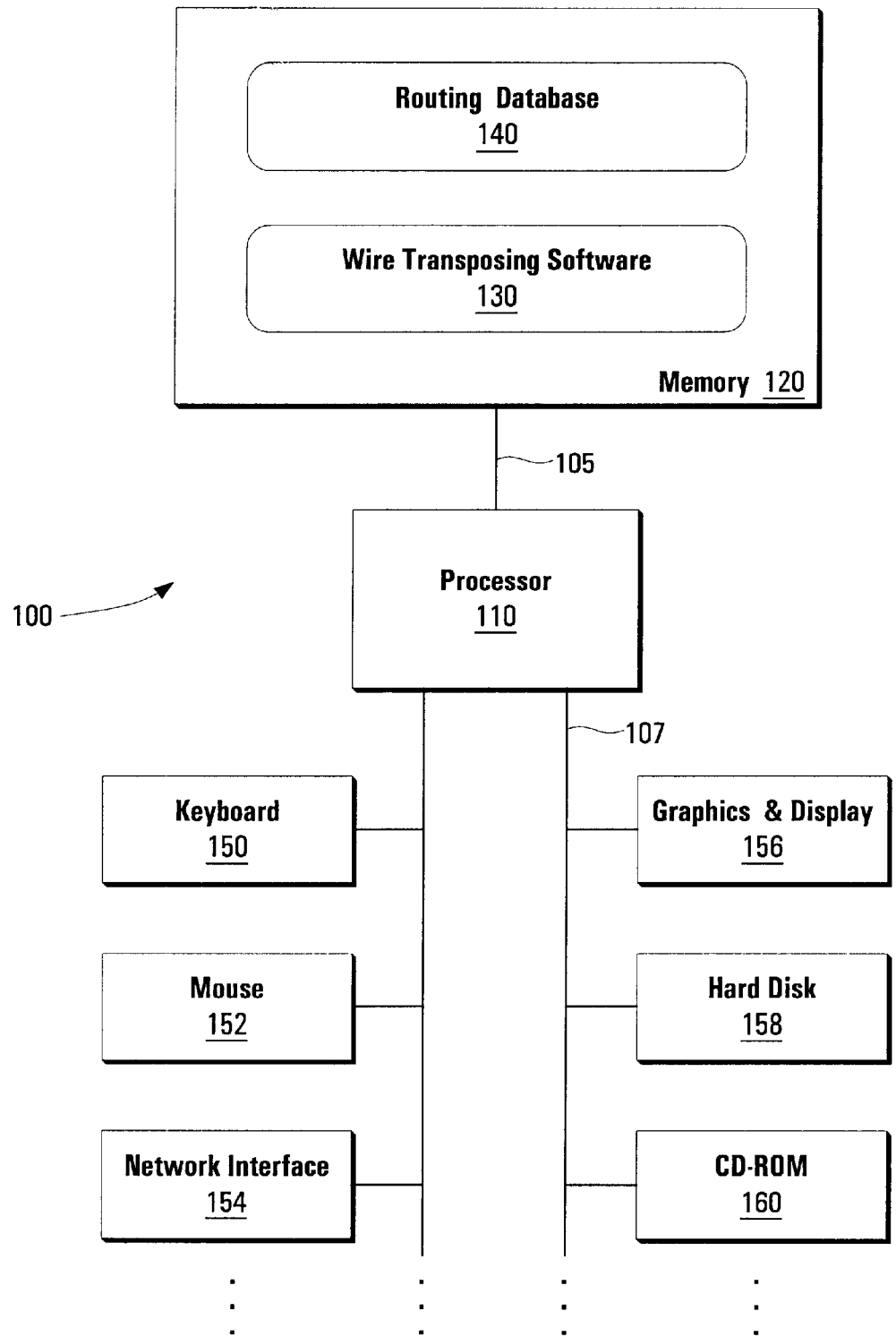
FIG. 1 is a block diagram of a computer system for implementing the tools and techniques of the present invention.

Because of the complexity of designing integrated circuits, many of the design steps are performed on a computer system. FIG. 1 illustrates a block diagram of a computer system 100 for implementing the design tools discussed below. Computer system 100 includes a processor 110 and a memory 120 coupled together by communications bus 105. Processor 110 can be a single processor or a number of individual processors working together. Memory 120 is typically random access memory (RAM), or some other dynamic storage device, and is capable of storing instructions to be executed by the processor, e.g., wire transposing software 130, and information used by the instructions, such as routing database 140. Memory 120 is also used for storing temporary variables or other intermediate information during the execution of instructions by the processor 110.

Wire transposing software 130 is one example of a software design tool, and in the present example, it is illustrative of a wire transposing method implemented in software. Those having ordinary skill in the art will ready recognize that the techniques and methods discussed below can be implemented in software using a variety of computer languages, including, for example, traditional computer languages such as assembly language, Pascal, and C; object oriented languages such as C++ and Java; and scripting languages such as Perl. Routing database 140 is one example of information that can be used by software such as wire transposing software 130 as part of the integrated circuit design process. Additionally, software 130 can be provided to the computer system via a variety of computer readable media including electronic media (e.g., flash memory), magnetic storage media (e.g., hard disk 158, a floppy disk, etc.), optical storage media (e.g., CD-ROM 160), and communications media conveying signals encoding the instructions (e.g., via a network coupled to network interface 154).

Computer system 100 also includes devices such as keyboard 150, mouse 152, network interface 154, graphics & display 156, hard disk 158, and CD-ROM 160, all of which are coupled to processor 110 by communications bus 107. It will be apparent to those having ordinary skill in the art that computer system 100 can also include numerous elements not shown in the figure, such as additional storage devices, communications devices, input devices, and output devices, as illustrated by the ellipsis shown.

Timing database 140 includes information produced by a router tool based on a netlist of the circuit design provided to the tool. Routers (such as the aforementioned FlexRoute and IC Craftsman) generally fall into one of two classes: channel-based and area-based. Channel-based routing assumes that all cells (devices) are arranged neatly into rows, with reserved tracks for interconnects. The placement of the rows is relative because the track width is adjusted by the tool to ensure 100% routing completion. The main disadvantages to channel-based routers are that they result in unpredictable die size, force iteration with floorplanning and impose restrictions on cell design. Area-based routing assumes that cell placement is fixed, and it does its best to complete the route within a known area and die size. Area-based routers enjoy the advantages of predictable die size without floorplan iteration and greater flexibility in cell design. The traditional disadvantages with area-based routers are that they do not guarantee 100% route completion and may not make best use of available silicon area.

Additionally, routing algorithms generally fall into two categories: gridded or gridless. Gridded routers divide the routing area in a uniform grid for every metal layer. This is equal to width plus spacing for that metal layer. Gridded routers require that all the wires on any metal layer use one grid or a whole integer multiple of the grid for routing any wire. This approach may waste die space, for example with a wire that only needs 1.2 times the grid. The main advantage of gridded routers is that they can handle very large designs. One disadvantage is that they cannot efficiently handle variable width and spacing. With the advent of 0.25 micron and below technologies, variable width and spacing is required for long wires to satisfy noise, delay, crosstalk or signal integrity issues. A gridless router is a shape-based or object-based router that views pins, wires and blockages as objects and routes around them instead of using a routing grid. The advantage of a gridless router is that it gives the user complete control over wire width and spacing. It can address signal integrity and crosstalk issues by using wide spacing for wires and can also address delay and electromigration issues by increasing wire width without any area penalty. Gridless routers can also handle blocks with different pin pitches thereby making it easier to route blocks with different physical characteristics (such as intellectual property blocks) in a given design. The main disadvantage of a gridless router is that it can only handle a limited number of objects or shapes. Therefore, gridless routers are mainly used for top level routing or interblock routing where the number of nets is limited to 10,000 to 25,000. They are generally not used for inside-the-block or standard cell routing because of capacity limitations.

Whatever the type of routing tools used, the end product is a routing database that describes the geometry of the wires between circuit elements, including the paths that the wires take within and between metal layers of the integrated circuit's interconnect scheme.

FIGS. 2A–2E illustrate the effects of employing an automated wire transposing procedure on a two-wire bus. Note that a two-wire bus is shown for simplicity, and that the transposing procedure described can be implemented with any size bus or collection of wires.

Figure 2A:
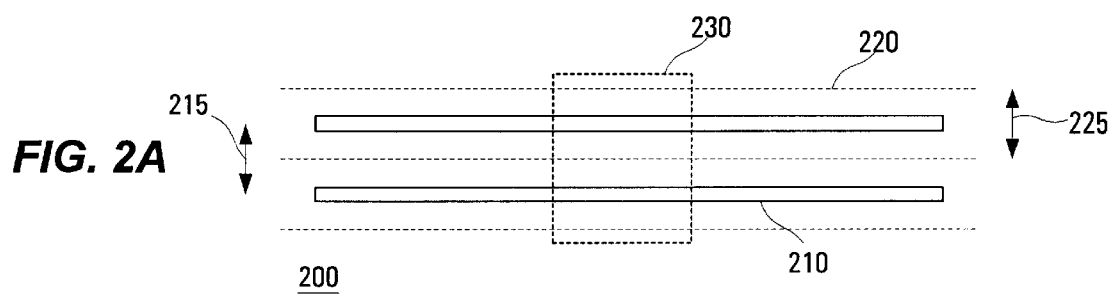
FIGS. 2A–2E illustrate several steps in transposing wires for a two-wire bus.

In FIG. 2A, two wires 210 in first metal layer 200 form the bus lines. Each of the wires 210 has an associated track 220 for design purposes, thereby defining the space needed surrounding the wire to satisfy the circuit's design rules. As illustrated, each track 220 has a track width 225 defined by the design rules for the circuit. Another design rule is implemented through the wire separation or pitch 215. As is well known to those having ordinary skill in the art, the various design parameters 215, 225, and others not illustrated, are specified by circuit designers, and affect the routing of wires in the circuit design.

The size of transposing region 230 is defined based on the number of lines to be transposed, the design rules being implemented, and the metal layers in which the transposing is to occur. For example, transposing the two wires will require a transposing segment from one wire to be routed through a second metal layer, while a transposing segment for the other wire will remain in first metal layer 200. Thus, transposing region 230 should be at least as wide as track 220 for first metal layer 200 (and at least as wide a second metal layer track for second metal layer 250). In practice, transposing region 230 is wider to ensure that no design rules are violated. Thus, the width of a transposing region can generally be represented as:

$b/2+d,$ where b is number of bus lines in the bus, and d is some multiple of track width required to satisfy design rules. Typically, d is either one (as illustrated in FIG. 2A) or two track widths.

Figure 2B:
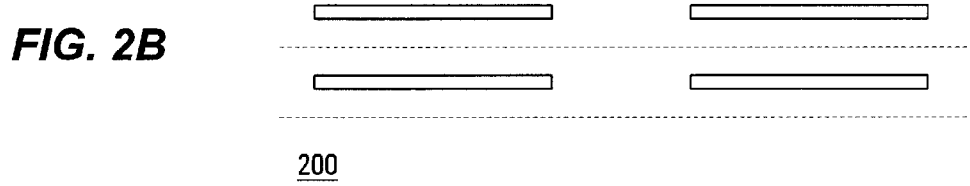
Figure 2C:
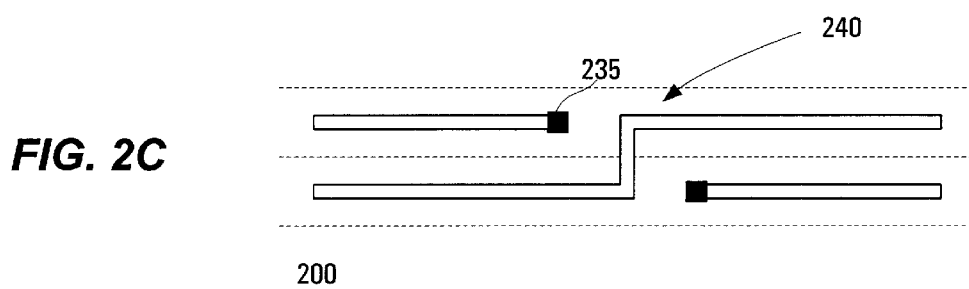
Figure 2D:
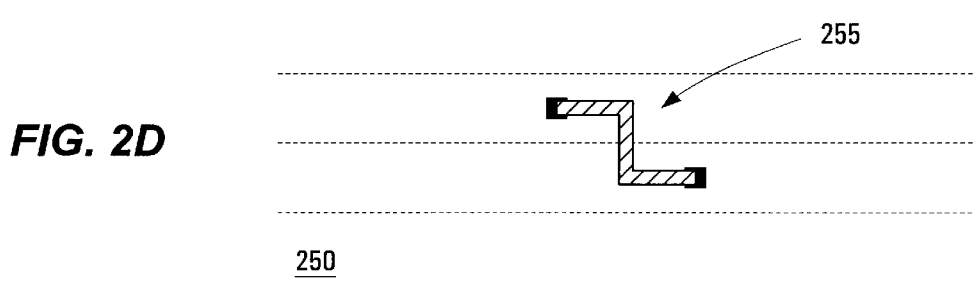
Figure 2E:
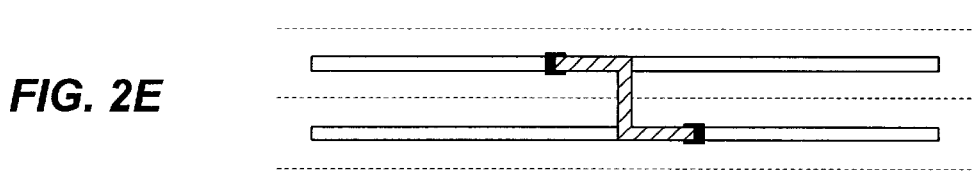

FIG. 2B illustrates the portions of wires 210 removed in first metal layer 200 in preparation for inserting a transposing segment. Note that in practice, no real segment is removed from the wires, but instead appropriate changes are made to the wire descriptions corresponding to wires 210 in routing database 140, and the nature of those changes depends upon the format of the database. In FIG. 2C, first metal layer to second metal layer vias 235 are inserted, as is a transposing segment 240. As previously noted, only half (in this case one wire) of the bus wires are transposed in first metal layer 200. Vias 235 provide interconnect paths to second metal layer 250, which is the metal layer that contains transposing segment 255 as illustrated in FIG. 2D. FIG. 2E illustrates the two metal layers superimposed upon each other.

Figure 3A:
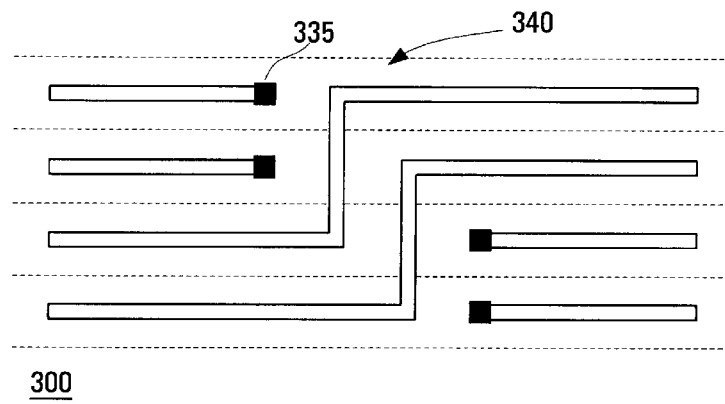
FIGS. 3A–3B illustrate two metal layers used to transpose wires for a four-wire bus.
Figure 3B:
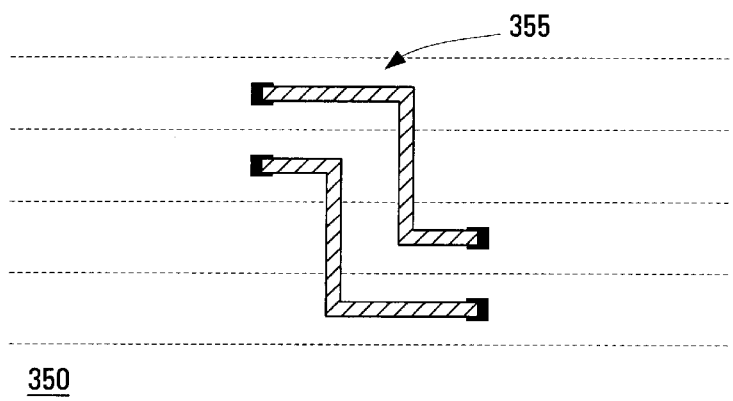
Figure 4A:
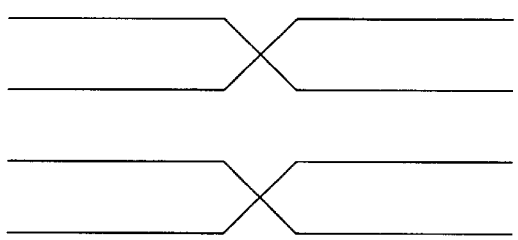
FIGS. 4A–4C illustrate examples of different wire transposing patterns.
Figure 4B:
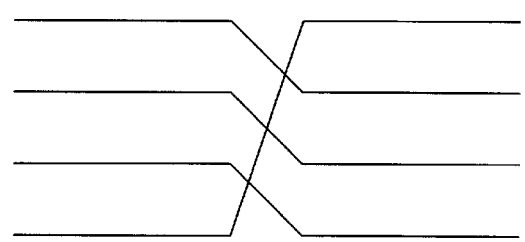
Figure 4C:
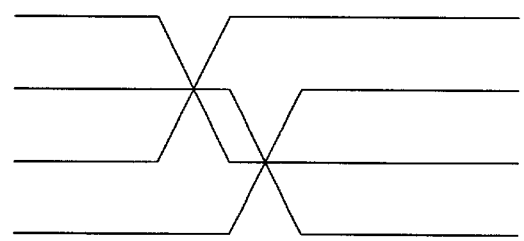

FIGS. 3A–3B illustrate two metal layers 300 and 350 that accomplish transposing of the wires in a four-bit bus. Vias 335 are inserted to accommodate transposing segments 355 through metal layer 350, while transposing segments 340 are placed in metal layer 300. The examples of FIGS. 2A–2E and 3A–3B illustrate a typical transposing pattern where outer bus lines are moved inward, and vice versa. This of course is only one of the many transposing patterns that can be used, and that will be well known to those having ordinary skill in the art. FIGS. 4A–4C illustrate examples of three other transposing patterns: nearest-neighbor, next-in-line, and next-nearest-neighbor, respectively.

Figure 5:
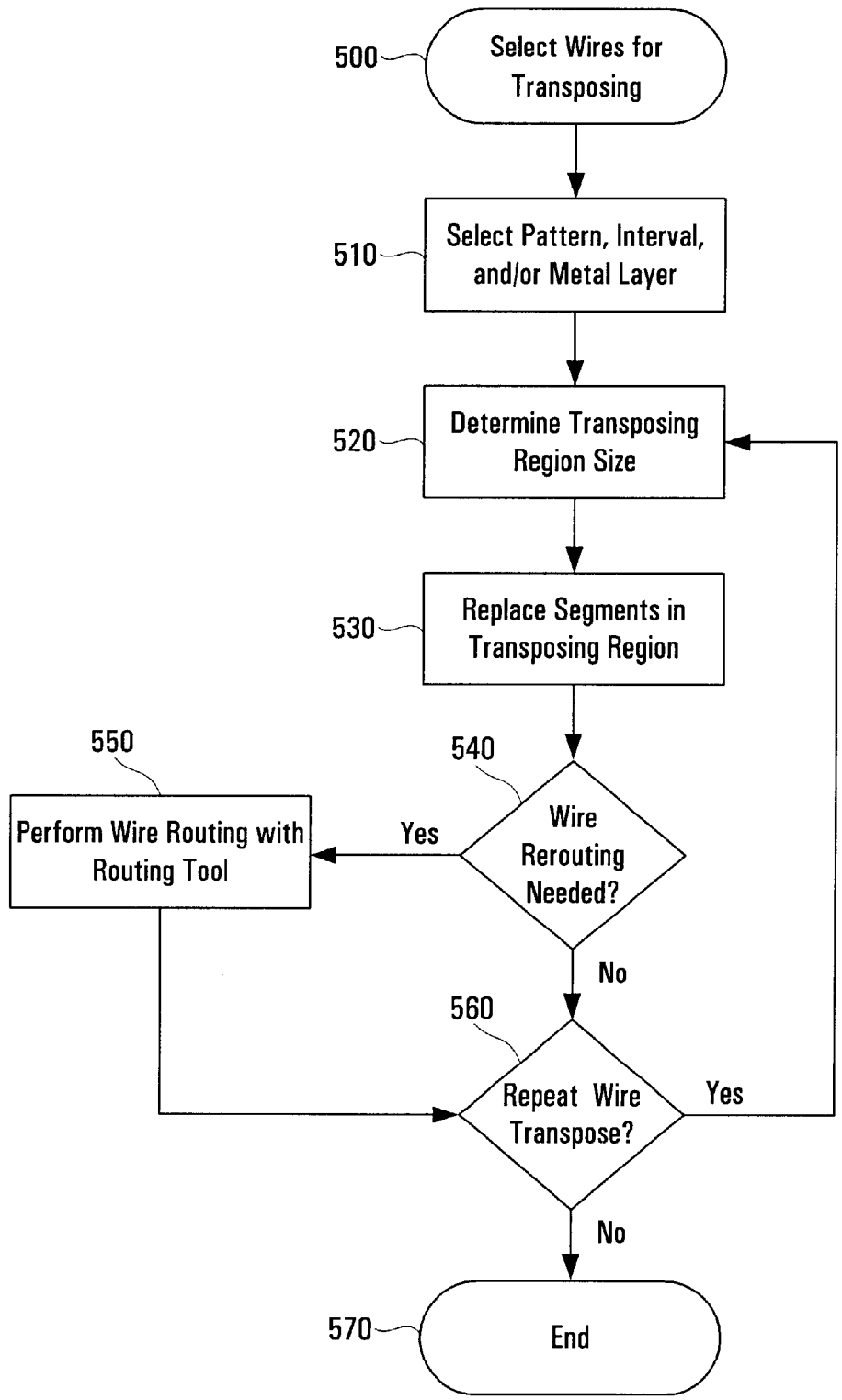
FIG. 5 is a flow chart illustrating an integrated circuit wire transposing procedure.

FIG. 5 is a flow chart illustrating an integrated circuit wire transposing procedure utilizing information from routing database 140. As indicated by wire transposing software 130, some or all of the procedure illustrated in FIG. 5 is usually performed by software.

The procedure begins at 500 where wires to be transposed are selected. This can be accomplished in a number of ways. For example, if routing database 140 labels all of the wires belonging to a particular bus with some designation unique to that bus, a user could simply request that that bus be transposed. Alternately, a user could request that all busses in database 140 be transposed, or the user could specifically select individual wires to undergo the transposing procedure. The manner in which wires and/or buses are selected can be parameter files used by the tool, parameters entered via a command line, a graphical user interface, or any other suitable means. Moreover, wire and/or bus selection need not be performed by a user, but can be based on software intelligence. For example, the tool can select buses to be transposed based on the results of the analysis of the parasitic effects occurring in the circuit.

In 510, one or more transposing patterns are selected. Different transposing patterns can be selected for different busses, and indeed several different transposing patterns can be used on the same bus. Typically, wire transposing will occur at a specified interval across the length of a bus, and so that interval is also specified. In general, transposing on a particular bus will occur an even number of times, so as to render the inputs and output the same. However, this need not be the case if a facility is included for revising the netlist associated with circuit elements receiving the bus lines. Other parameters, such as the metal layer through which some of the transposing segments are routed are also selected in 510. Although it is preferred that only one additional metal layer be used for transposing (i.e., the metal layer in which the original bus lines are routed, and one additional layer for transposing half of the lines), multiple metal layers can be used.

The size of the transposing region is determined in 520. As noted above, with regard to transposing region 230, the size of the transposing region can depend on the number of wires being transposed, the pattern, design rules for the circuit, and the metal layers used. For example, if a transposing pattern is selected where the transposed lines are not neighbors, a larger transposing region may be needed to accomplish transposing within the confines of the design rules. In 530 wire descriptions are modified according to the transposing pattern. The portions of the wire paths that are modified are generally limited to those portions or segments of the paths that fall within the transposing region.

In 540, whether the transposing requires rerouting of other wires is determined. For example, those transposing segments that are placed in a metal layer different from that which contains the original bus may interfere with existing wires. The portions of the wires that are displaced, e.g., portions that are removed based on the size of the transposing region must be accounted for. If re-routing is needed, wire re-routing is performed in 550 by a routing tool. This can be accomplished by designating the transposing region "off-limits" and requiring the router to re-route affected wires. Alternatively, the re-routing can be postponed for a subsequent re-routing iteration for all wire that must be re-routed. If no re-routing is needed, the procedure proceeds to 560. If additional transposing is to be performed, then operation returns to 520. For example, if a user specified that transposing occur at 500 µm intervals on a bus that is approximately 2000 µm long, then the process must be repeated. When there is no longer a need to transpose wires in the selected group of wires and or bus, the procedure ends. Of course, this procedure could be repeated numerous times for a given circuit design depending on the need to transpose different busses or wire groups.

The description of the invention set forth herein is illustrative and is not intended to limit the scope of the invention as set forth in the following claims. Variations and modifications of the embodiments disclosed herein may be made based on the description set forth herein, without departing from the scope and spirit of the invention as set forth in the following claims.

What is claimed is:

1. A computer implemented method of transposing a plurality of wires in a circuit design comprising:

providing a database including a plurality of wire descriptions, each of the plurality of wire descriptions including a path traversed by the wire in the circuit design;

defining a transposing region around portions of a first and a second path corresponding to a first and a second wire description of the plurality of wire descriptions, respectively, the transposing region dividing the first path into a first leading path segment, a first transposing path segment, and a first ending path segment, and the transposing region further dividing the second path into a second leading path segment, a second transposing path segment, and a second ending path segment;

replacing the first transposing path segment with a first new transposing path segment between the first leading path segment and the second ending path segment, thereby modifying the first path for the first wire description; and replacing the second transposing path segment with a second new transposing path segment between the second leading path segment and the first ending path segment, thereby modifying the second path for the second wire description.

2. The method of claim 1 further comprising:

defining an additional transposing region around additional portions of the first and the second path corresponding to the first and the second wire description, respectively, the second transposing region dividing the first path into an additional first leading path segment, an additional first transposing path segment, and an additional first ending path segment, and the additional transposing region further dividing the second path into an additional second leading path segment, an additional second transposing path segment, and an additional second ending path segment;

replacing the additional first transposing path segment with an additional first new transposing path segment between the additional first leading path segment and the additional second ending path segment, thereby modifying the first path for the first wire description; and replacing the second transposing path segment with a second new transposing path segment between the second leading path segment and the first ending path segment, thereby modifying the second path for the second wire description.

3. The method of claim 2 wherein the transposing region and the additional transposing region are separated by a separation distance.

4. The method of claim 3 further comprising:

receiving the separation distance from a user.

5. The method of claim 1 wherein:

each of the plurality of wire descriptions includes path metal layer information;

the first new transposing path segment being in a first metal layer; and the second new transposing path segment being in a second metal layer.

6. The method of claim 5 further comprising:

rerouting a third path corresponding to a third wire description, the third path being affected by the second new transposing path segment being in the second metal layer.

7. The method of claim 1 wherein the defining a transposing region further comprises:

determining a transposing region size based on at least one of a wire transposing pattern, metal layer information, a wire size, and a design rule.

8. The method of claim 7 wherein the wire transposing pattern is one of a nearest-neighbor pattern, a next-in-line pattern, and a next-nearest-neighbor pattern.

9. The method of claim 1 encoded in a computer readable medium as instructions executable on a processor, the computer readable medium being one of an electronic storage medium, a magnetic storage medium, an optical storage medium, and a communications medium conveying signals encoding the instructions.

10. The method of claim 1 wherein the database is produced by a routing tool.

11. A computer implemented method of transposing a plurality of wires in a circuit design comprising:

providing a database including a plurality of wire descriptions, each of the plurality of wire descriptions including a path traversed by the wire in the circuit design;

receiving a wire transposing pattern for application to at least a first and a second wire description of the plurality of wire descriptions;

replacing a first portion of the first wire description path with a first new portion, and replacing a second portion of the second wire description path with a second new portion such that the first wire description path and the second wire description path are transposed according to the transposing pattern; and determining a size of the first portion of the first wire description path and a size of the second portion of the second wire description path based on at least one of the wire transposing pattern, metal layer information, a wire size, and a design rule.

12. The method of claim 11 encoded in a computer readable medium as instructions executable on a processor, the computer readable medium being one of an electronic storage medium, a magnetic storage medium, an optical storage medium, and a communications medium conveying signals encoding the instructions.

13. The method of claim 11 wherein the database is produced by a routing tool.

14. The method of claim 11 wherein the wire transposing pattern is one of a nearest-neighbor pattern, a next-in-line pattern, and a next-nearest-neighbor pattern.

15. An apparatus comprising:

a processor;

a memory coupled to the processor; and a circuit design program at least partially storable in the memory, and executable on the processor, the program including:

a wire selection routine for selecting a plurality of wire descriptions from a database, each of the plurality of wire descriptions including a path traversed by the wire in a circuit design;

a transposing region definition routine for defining a transposing region around portions of-a first and a second path corresponding to a first and a second wire description of the plurality of wire descriptions, respectively, the transposing region dividing the first path into a first leading path segment, a first transposing path segment, and a first ending path segment, and the transposing region further dividing the second path into a second leading path segment, a second transposing path segment, and a second ending path segment;

a replacement routine for replacing the first transposing path segment with a first new transposing path segment between the first leading path segment and the second ending path segment, thereby modifying the first path for the first wire description.

16. The apparatus of claim 15 wherein the wire selection routine is operable to receive a wire selection input from a user.

17. The apparatus of claim 15 wherein:

each of the plurality of wire descriptions includes path metal layer information;

the first new transposing path segment being in a first metal layer; and the second new transposing path segment being in a second metal layer.

18. The apparatus of claim 17 further comprising:

a rerouting routine for rerouting a third path corresponding to a third wire description, the third path being affected by the second new transposing path segment being in the second metal layer.

19. The apparatus of claim 15 wherein the transposing region definition routine defines the transposing region based on at least one of a wire transposing pattern, metal layer information, a wire size, and a design rule.

20. The apparatus of claim 19 wherein the wire transposing pattern is one of a nearest-neighbor pattern, a next-in-line pattern, and a next-nearest-neighbor pattern.

21. The apparatus of claim 15 wherein the database is produced by a routing tool.

* * * * *

UNITED STATES PATENT AND TRADEMARK OFFICE
CERTIFICATE OF CORRECTION

PATENT NO.   : 6,480,996 B1
DATED        : November 12, 2002
INVENTOR(S)  : Sandeep A. Aji, Shantanu Ganguly and John Paz It is certified that error appears in the above-identified patent and that said Letters Patent is hereby corrected as shown below:

Title page,
Item [57], ABSTRACT,
Line 1, after "parameterized", delete "compute" and insert -- computer --.
Line 3, after "can", please delete "y" and insert -- yield --.
Line 5, after "transposing", please delete "porn" and insert -- pattern --.

Column 9,
Line 31, after "of", please delete "-".

Signed and Sealed this

Fourth Day of November, 2003

JAMES E. ROGAN
*Director of the United States Patent and Trademark Office*